US012092261B2

(12) United States Patent
Jarema, III et al.

(10) Patent No.: US 12,092,261 B2
(45) Date of Patent: Sep. 17, 2024

(54) MODULAR WALL-MOUNTABLE DIGITAL JUKEBOX

(71) Applicant: AMI Entertainment Network, LLC, Trevose, PA (US)

(72) Inventors: Stephen Jarema, III, Pittsgrove, NJ (US); Jeffrey J. Kalis, Sparta, MI (US)

(73) Assignee: AMI ENTERTAINMENT NETWORK, LLC, Grand Rapids, MI (US)

( * ) Notice: Subject to any disclaimer, the term of this patent is extended or adjusted under 35 U.S.C. 154(b) by 229 days.

(21) Appl. No.: 17/882,130

(22) Filed: Aug. 5, 2022

(65) Prior Publication Data

US 2023/0044039 A1 Feb. 9, 2023

Related U.S. Application Data

(60) Provisional application No. 63/230,367, filed on Aug. 6, 2021.

(51) Int. Cl.
| | |
|---|---|
| *F16M 13/02* | (2006.01) |
| *F16M 11/04* | (2006.01) |
| *G06F 3/16* | (2006.01) |
| *H04N 21/4363* | (2011.01) |
| *H04R 3/00* | (2006.01) |
| *H05K 5/00* | (2006.01) |
| *H05K 5/02* | (2006.01) |

(52) U.S. Cl.
CPC ........ *F16M 13/022* (2013.01); *F16M 11/045* (2013.01); *G06F 3/165* (2013.01); *H04N 21/43635* (2013.01); *H04R 3/00* (2013.01); *H05K 5/0017* (2013.01); *H05K 5/0204* (2013.01); *F16M 2200/028* (2013.01)

(58) Field of Classification Search
CPC ............... F16M 13/022; F16M 11/045; F16M 2200/028; F16M 11/046; F16M 11/22; F16M 13/02; G06F 3/165; H04N 21/43635; H04R 3/00; H04R 1/025; H05K 5/0017; H05K 5/0204
See application file for complete search history.

(56) References Cited

U.S. PATENT DOCUMENTS 9,702,500 B2    7/2017  Jarema, III et al.
2022/0044665 A1*  2/2022  Arefti ................ G07C 9/00896

* cited by examiner

*Primary Examiner* — Adil Ocak
(74) *Attorney, Agent, or Firm* — Panitch Schwarze Belisario & Nadel LLP

(57) ABSTRACT

A wall-mounted jukebox system for mounting adjacent to a wall-mounted external video display includes a jukebox having a controller configured to play digital music and/or digital video files, a communication module connected to the controller and configured for wireless and/or wired communication with one or more external devices, a video output port connected to the controller and configured to enable the jukebox to be connected to the wall-mounted external video display, and a cabinet housing the controller, communication module, and video output port. A mounting bracket is configured to receive the jukebox and to be affixed to the wall adjacent to the wall-mounted external video display. The jukebox lacks a physical user interface, a video display screen, and a physical payment acceptor, and selection of the digital music and/or digital video file for play by the controller and payment are received through the communication module from an external device.

19 Claims, 10 Drawing Sheets

MODULAR WALL-MOUNTABLE DIGITAL JUKEBOX

CROSS-REFERENCE TO RELATED APPLICATIONS

This application claims the benefit of U.S. Provisional Patent Application No. 63/230,367, filed Aug. 6, 2021, entitled "Modular Wall-Mountable Digital Jukebox," the entire contents of which are incorporated by reference herein.

BACKGROUND

Embodiments described herein relate generally to a wall-mounted digital jukebox, and more particularly, to a modular wall-mounted digital jukebox that is compatible for mounting adjacent to a pre-installed video display.

Jukeboxes allowing selection and play of songs are generally known. Jukeboxes are typically installed in locations such as bars, restaurants, airports, shopping malls, video arcades, casinos, or the like, and operate following receipt of payment by a user. While jukeboxes have progressed to the point that songs can now be stored and played digitally, as opposed to on vinyl records or compact discs located within the machine, jukeboxes nevertheless remain relatively large in size. For example, jukeboxes typically require a physical user input, such as a touchscreen, keyboard, and/or the like to permit search and selection of desired songs. Some jukeboxes include coin or bill acceptors, necessitating storage space. Many jukeboxes also include built-in video screens to play music videos, advertisements, or other material during operation. This causes several disadvantages. First, the numerous components required for the jukebox result in a heftier price tag. Second, the large size can often lead to venue managers installing jukeboxes in "out of the way" locations, such as in a corner, near a restroom, in an alcove, or the like.

It is desirable to leverage the presence of a venue's own pre-installed video displays, such as televisions, for use with a jukebox in order to reduce cost and enhance location prominence. It is further desirable to provide a jukebox that does not require physical presence of a user for song selection and play, which provides additional installation location options (e.g., above a bar or table) since the user does not need to touch the jukebox.

BRIEF SUMMARY

Briefly stated, one embodiment comprises a wall-mounted jukebox system configured to be mounted adjacent to a wall-mounted external video display. The jukebox system includes a jukebox having a controller configured to play at least one of digital music or digital video files, a communication module connected to the controller and configured for at least one of wireless or wired communication with one or more external devices, a video output port connected to the controller and configured to enable the jukebox to be connected to the wall-mounted external video display, and a cabinet housing the controller, communication module, and video output port. A mounting bracket is configured to receive the jukebox and to be affixed to the wall adjacent to the wall-mounted external video display. The jukebox lacks a physical user interface, a display screen, and a physical payment acceptor. Selection of the at least one digital music or digital video file for play by the controller and payment are received through the communication module from one of the external devices.

In one aspect, the jukebox system further includes a sliding bracket connected to the cabinet, wherein the mounting bracket is configured to receive the sliding bracket for slidable movement of the sliding bracket and the jukebox relative to the mounting bracket, and a lock provided on one of the sliding bracket or the mounting bracket that, when engaged to the other of the sliding bracket or the mounting bracket, prevents the slidable movement of the sliding bracket and the jukebox relative to the mounting bracket. In another aspect, the lock is a latch bar provided on the sliding bracket. The latch bar includes at least one latching hook, the mounting bracket includes at least one latch slot, and the lock engagement includes insertion of the at least one latching hook into the at least one latch slot. In another aspect the mounting bracket includes a generally planar attachment plate and a pair of rails connected to the attachment plate and extending generally perpendicularly away therefrom. In another aspect, the at least one latch slot is provided in at least one of the rails of the mounting bracket. In another aspect, the mounting bracket includes a plurality of latch slots. In another aspect, the latch bar includes at least one guide track configured to receive at least one guide pin attached to at least one of the sliding bracket or the jukebox. The at least one guide pin is movable within the at least one guide track when the latch bar moves relative to the sliding bracket.

In another aspect, the mounting bracket includes a generally planar attachment plate and a pair of rails connected to the attachment plate and extending generally perpendicularly away therefrom. In another aspect, the attachment plate includes a plurality of mounting slots formed therethrough. In another aspect, the rails include a plurality of display mount holes configured to connect with a display mount of the wall-mounted external video display.

In another aspect, the sliding bracket includes a main plate and a pair of side rails. In another aspect, each side rail includes one or more guide slots configured to receive a respective guide pin extending from the mounting bracket. Each guide pin is movable within the respective one or more guide slots when the sliding bracket is moved relative to the mounting bracket.

In another aspect, the jukebox system further includes a light bar having one or more light emitting elements disposed therein. Operation of the one or more light emitting elements is controllable by the controller of the jukebox. In another aspect, the light bar is configured to mount to the wall-mounted external video display. In another aspect, the jukebox further includes a light bar port housed by the cabinet and connectable to the light bar.

In another aspect, the communication module is connectable to a wireless network. In another aspect, the wireless network is one of a Wi-Fi network or a cellular network.

In another aspect, the video output port is an HDMI port.

In another aspect, the jukebox includes at least one of an audio preamplifier with direct line output or an amplifier configured to connect to one or more speakers.

BRIEF DESCRIPTION OF THE SEVERAL VIEWS OF THE DRAWINGS

The following detailed description of preferred embodiments will be better understood when read in conjunction with the appended drawings. For the purpose of illustration, there are shown in the drawings embodiments which are presently preferred. It should be understood, however, that the invention is not limited to the precise arrangements and instrumentalities shown.

In the Drawings.

DETAILED DESCRIPTION

Figure 1:
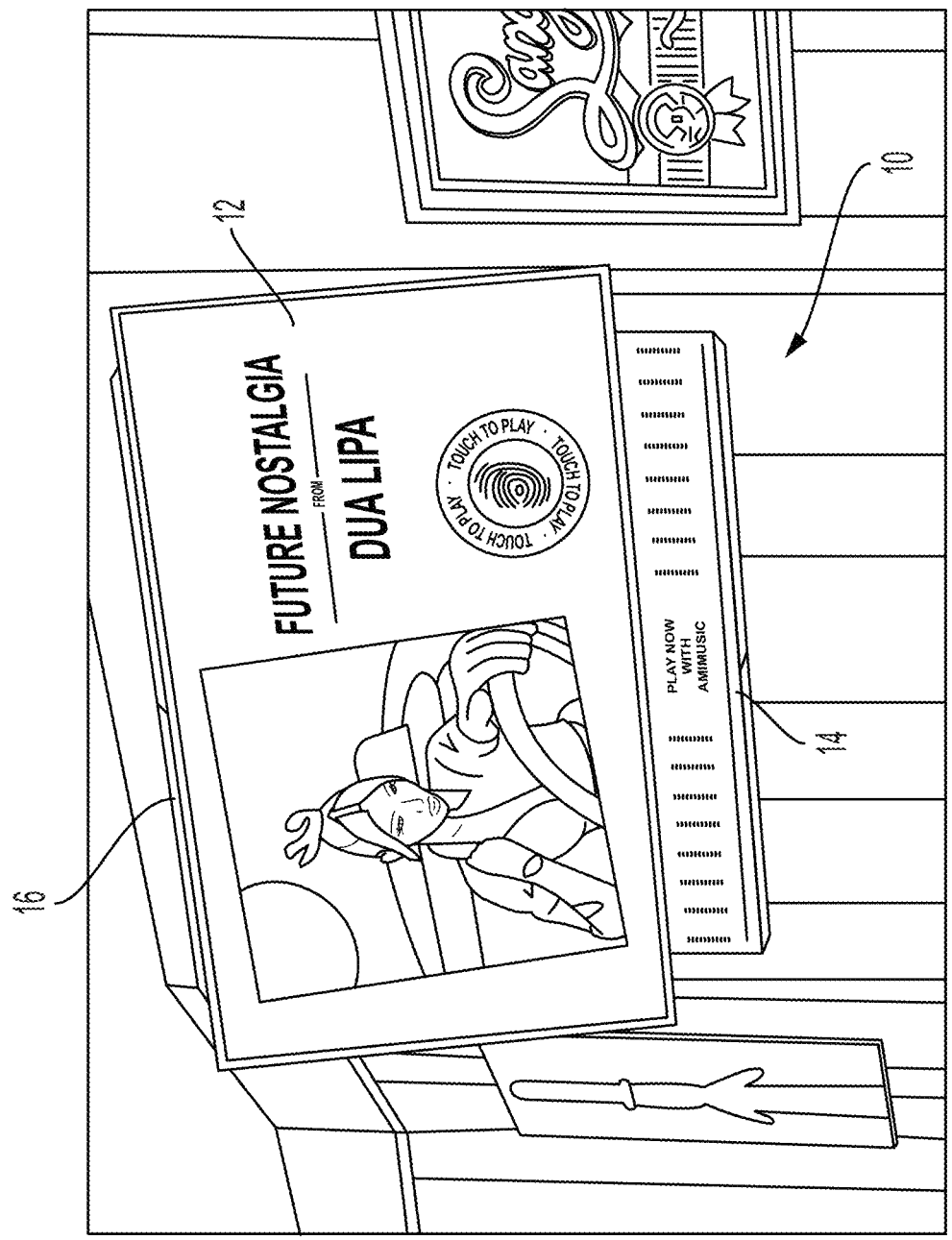
FIG. 1 is a front side perspective view of a first example embodiment of the wall-mounted jukebox system connected to a video display.

Certain terminology is used in the following description for convenience only and is not limiting. The words "right", "left", "lower", and "upper" designate directions in the drawings to which reference is made. The words "inwardly" and "outwardly" refer to directions toward and away from, respectively, the geometric center of the device and designated parts thereof. The terminology includes the above-listed words, derivatives thereof, and words of similar import. Additionally, the words "a" and "an", as used in the claims and in the corresponding portions of the specification, mean "at least one."

It should also be understood that the terms "about," "approximately," "generally," "substantially" and like terms, used herein when referring to a dimension or characteristic of a component, indicate that the described dimension/characteristic is not a strict boundary or parameter and does not exclude minor variations therefrom that are functionally similar. At a minimum, such references that include a numerical parameter would include variations that, using mathematical and industrial principles accepted in the art (e.g., rounding, measurement or other systematic errors, manufacturing tolerances, etc.), would not vary the least significant digit.

Referring to FIG. 1, there is shown a first example embodiment of a wall-mounted jukebox system 10 in use with a video display 12. The jukebox system 10 may include a wall-mounted jukebox 14, which is shown installed generally adjacent to a bottom edge of the video display 12. The jukebox system 10 may further include a light bar 16 mounted to or adjacent a top edge of the video display 12. As explained in further detail below, the light bar 16 may be communicatively connected to the jukebox 14 for the purpose of receiving power, control signals, or the like.

FIGS. 2-6 show a second example embodiment of a wall-mounted jukebox system 100 in use with a video display 112 (although a light bar is not shown in FIG. 2), and more particularly, a mounting system for attaching the jukebox 114 to a wall or other surface (not shown) adjacent to the video display 112. The jukebox 114 may include a cabinet 117, which can be formed at least by a front panel 118 and a back panel 115, although side panels and/or other types of panels or surfaces may be utilized as well. A mounting bracket 120 may be provided to facilitate attachment of the jukebox 114 to the wall or other surface. The mounting bracket 120 shown in FIGS. 3-6 has a generally planar attachment plate 120a configured to face or contact the wall or other surface when installed. A plurality of mounting slots 122 are formed through the attachment plate 120a and are sized to allow passage of screws or other fasteners (not shown) to affix the mounting bracket 120 to the wall or other surface. Although not required, the mounting slots 122 may be spaced apart from one another by a predetermined or standard distance to allow for attachment of the screws or other fasteners into standard-spaced wall studs or the like. As seen in the drawings, the mounting slots 122 may also be elongated in one or more directions (e.g., horizontally) to allow for limited position adjustment of the mounting bracket 120 when attached to the wall or other surface.

The mounting bracket 120 may further include a pair of rails 120b extending generally perpendicularly with respect to the attachment plate 120a and away from the wall or other surface to which the mounting bracket 120 is attached. The rails 120b may be connected to the attachment plate 120a via welding, fasteners, or the like. Alternatively, the rails 120b may be formed integrally with the attachment plate 120a from a single piece of sheet metal or other material that is folded. Each rail 120b may include a plurality of display mount holes 124 that are arranged in a vertically extending row. Each of the display mount holes 124 in one rail 120b preferably aligns vertically with a corresponding display mount hole 124 in the opposing rail 120b. The display mount holes 124 are provided to allow attachment of a display mount (not shown) to the mounting bracket 120. For example, the display mount may be a component or set of components that connect directly to the video display 112 and may include a standard VESA mount or the like. The display mount may be connected to the mounting bracket 120 by fasteners (not shown) extending through selected ones of the display mount holes 124 on each rail 120b. The display mount holes 124 may be threaded for accepting appropriately dimensioned screws, threaded bolts, or other like fasteners. Alternatively, the display mount holes 124 may allow passage of a bolt or the like that can be secured from the opposite side, such as by a nut or the like. The number and spacing of display mount holes 124 preferably can accommodate display mounts of varying sizes as well as permit adjustment of mounting location to allow desired alignment of the video display 112 with the jukebox 114.

A sliding bracket 126 may be coupled to the mounting bracket 120 for slidable movement with respect thereto. In the example shown in FIGS. 3-5, the sliding bracket 126 includes a main plate 126a and a pair of vertically extending side rails 126b that may be spaced apart from the main plate 126a via respective side walls 126c. The main plate 126a, side rails 126b, and side walls 126c may be integrally formed of a single piece of sheet metal or other material that is folded to create the necessary structure, but may also be individual components connected together via welding, fasteners, or the like. The side walls 126c preferably extend generally perpendicularly with respect to both the main plate 126a and the side rails 126b.

Each side rail 126b of the sliding bracket 126 may include one or more guide slots 128 extending in a vertical direction. Each guide slot 128 is configured to receive a corresponding pin 130 extending from the attachment plate 120a of the mounting bracket 120 away from the wall or other surface. As the sliding bracket 126 moves vertically with respect to the mounting bracket 120, the pins 130 will slide within their respective guide slots 128 to control relative movement of the mounting bracket 120 and sliding bracket 126. The pins 130 may have, for example, nuts (not shown) provided at their free ends, with the nut widths being greater than the widths of the guide slots 128, to inhibit removal of the sliding bracket 126 away from the mounting bracket 120 in a non-vertical direction. Although the pins 130 may be used for this purpose, it is also possible to have other separate components (not shown) interacting between the mounting bracket 120 and the sliding bracket 126 to prevent removal.

The main plate 126a of the sliding bracket 126 is preferably connected to the jukebox 114, such as by fasteners or the like. For example, in FIG. 4, the sliding bracket 126 may be coupled to the back panel 115 of the jukebox 114. In this manner, the sliding bracket 126 can be used to mount the jukebox 114 to the mounting bracket 120 and to make the jukebox 114 movable with respect to the mounting bracket 120, so that the jukebox 114 may be accessed for service, replacement, or the like.

To keep the jukebox 114 in place, a lock may be provided on one of the sliding bracket 126 or the mounting bracket 120 such that, when engaged with the other of the sliding bracket 126 or the mounting bracket 120, relative movement between the two brackets 120, 126 can be prevented. In the embodiment shown in FIGS. 2-6, the lock is in the form of a latch bar 132 provided on the sliding bracket 126. The latch bar 132 may include a pair of latching hooks 134 that each extend generally perpendicularly with respect to a corresponding one of the rails 120b of the mounting bracket 120. The latching hooks 134 may engage with respective latch slots 136 in the rails 120b to prevent the sliding bracket 126, and therefore the jukebox 114, from sliding vertically with respect to the mounting bracket 120. The latch bar 132 may include one or more guide tracks 138 configured to receive respective guide pins 140 that are attached to the sliding bracket 126 and/or the jukebox 114. To disengage the latching hooks 134 from the latch slots 136, the latch bar 132 may be moved generally horizontally, as permitted by the engagement of the guide pins 140 and guide tracks 138, until the latching hooks 134 are clear of the latch slots 136, which allows the sliding bracket 126 and jukebox 114 to be moved relative to the mounting plate 120. However, the latch bar 132 can be configured in numerous different ways to allow for locking and unlocking operations. Moreover, alternative mechanisms for locking the sliding bracket 126 in place with respect to the mounting plate 120, such as locking pins and holes, catches, or the like can be used as well.

Figure 2:
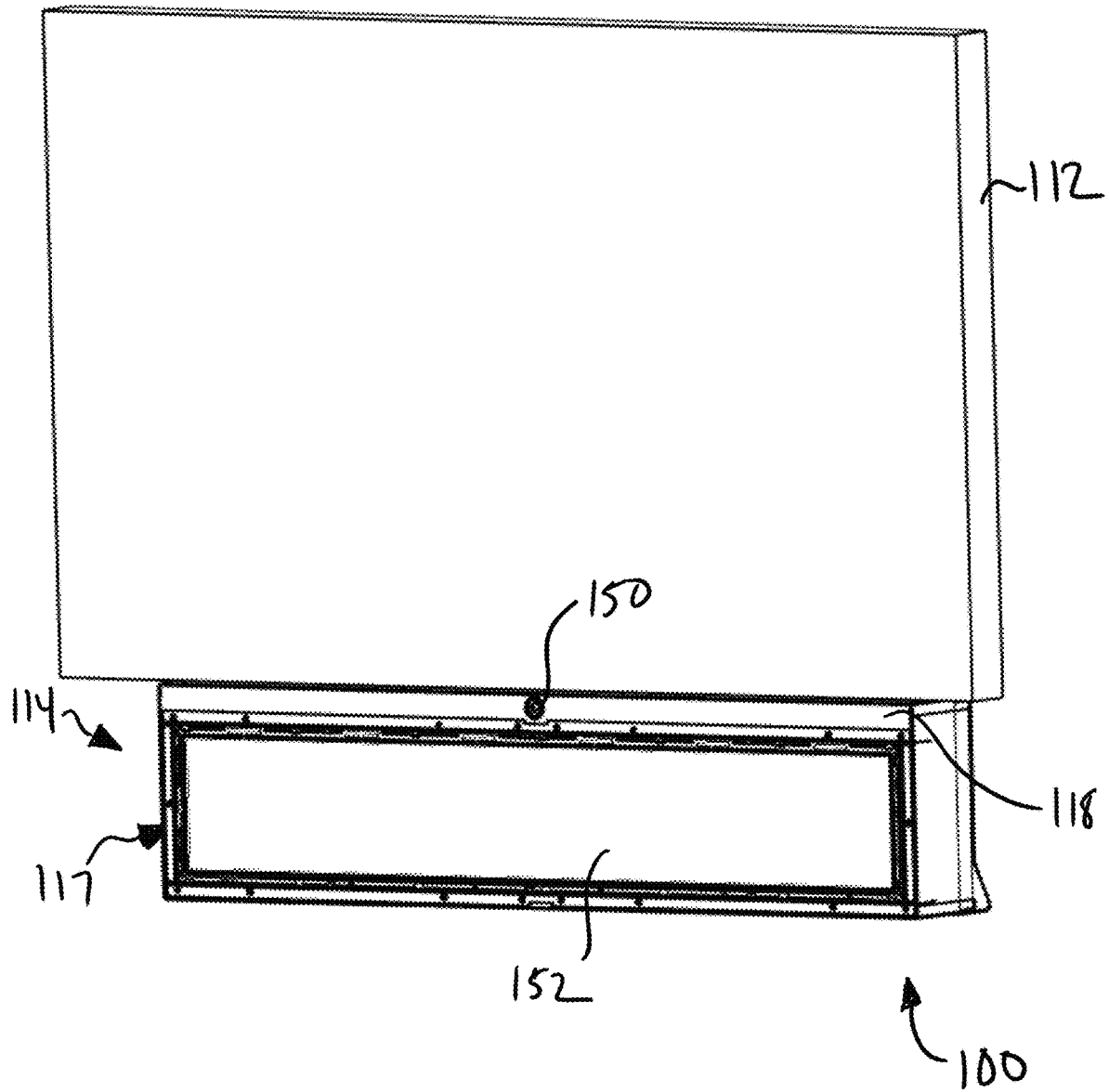
FIG. 2 is a front side perspective view of a second example embodiment of the wall-mounted jukebox connected to a video display without the top light bar.
Figure 3:
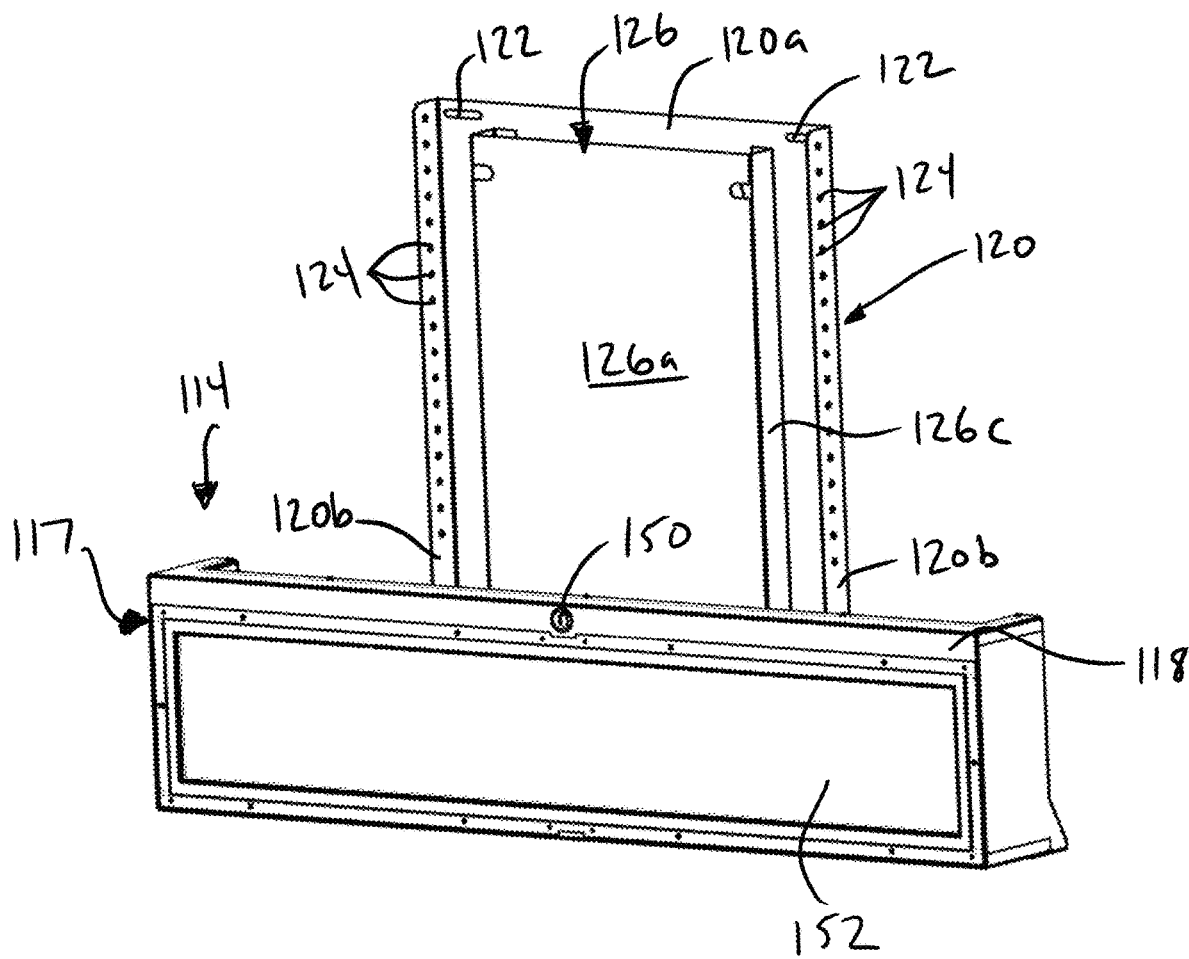
FIG. 3 is a front side perspective view of the wall-mounted jukebox of FIG. 2 with a mounting bracket and sliding bracket.
Figure 4:
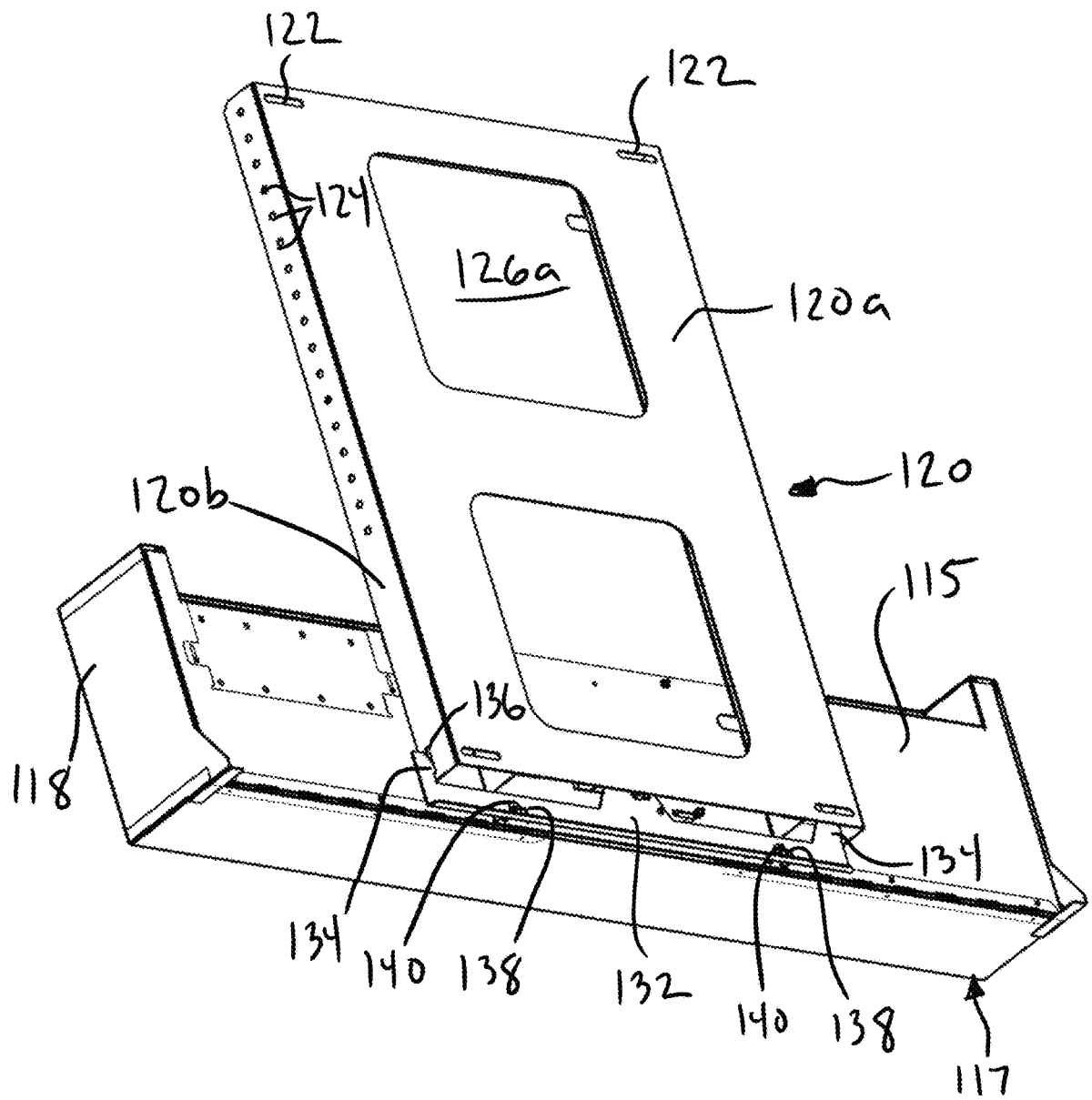
FIG. 4 is a rear side perspective view of the jukebox, mounting bracket, and sliding bracket of FIG. 3.
Figure 5:
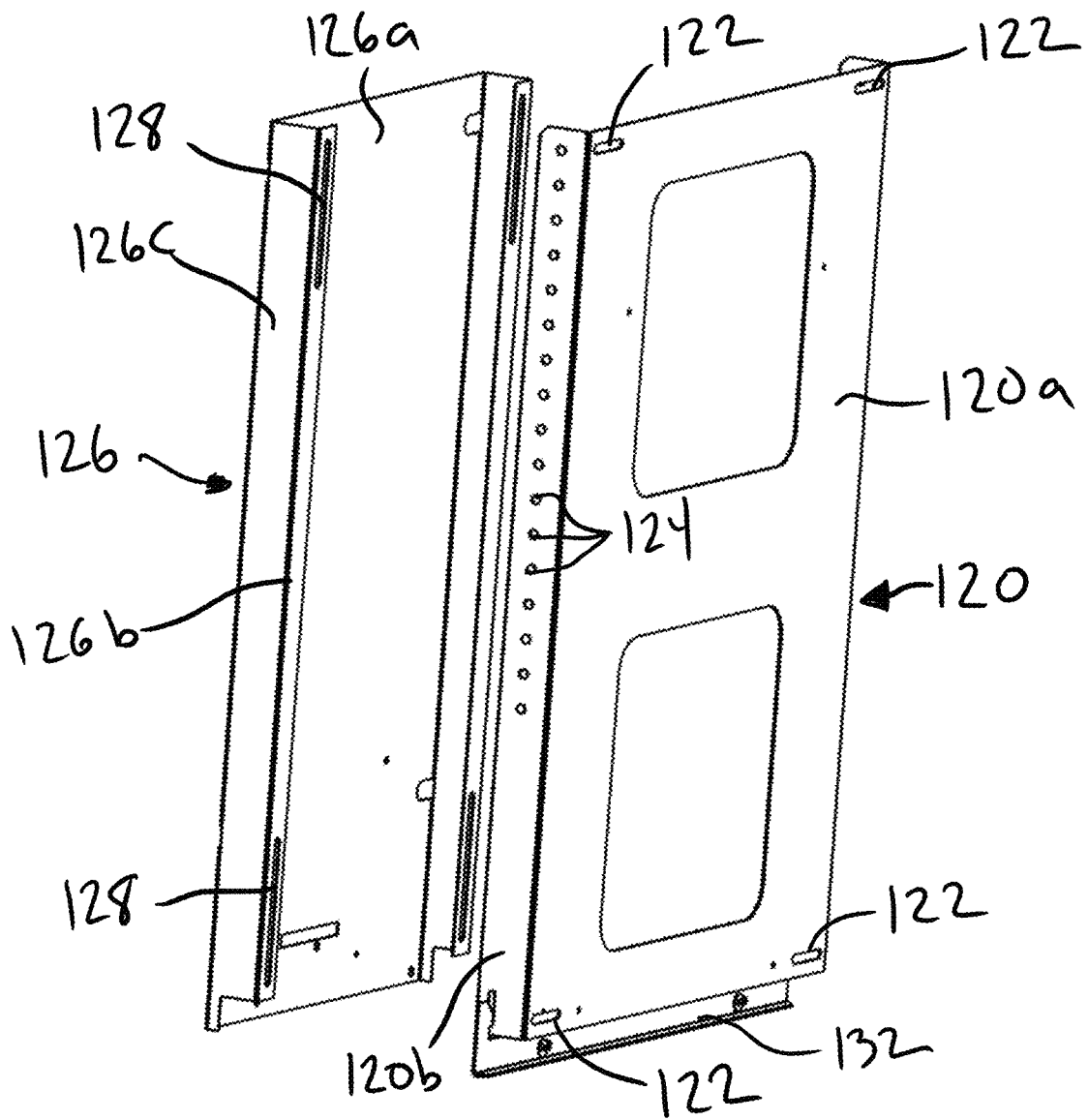
FIG. 5 is a rear side perspective exploded view of the mounting bracket and sliding bracket of FIG. 3.
Figure 6:
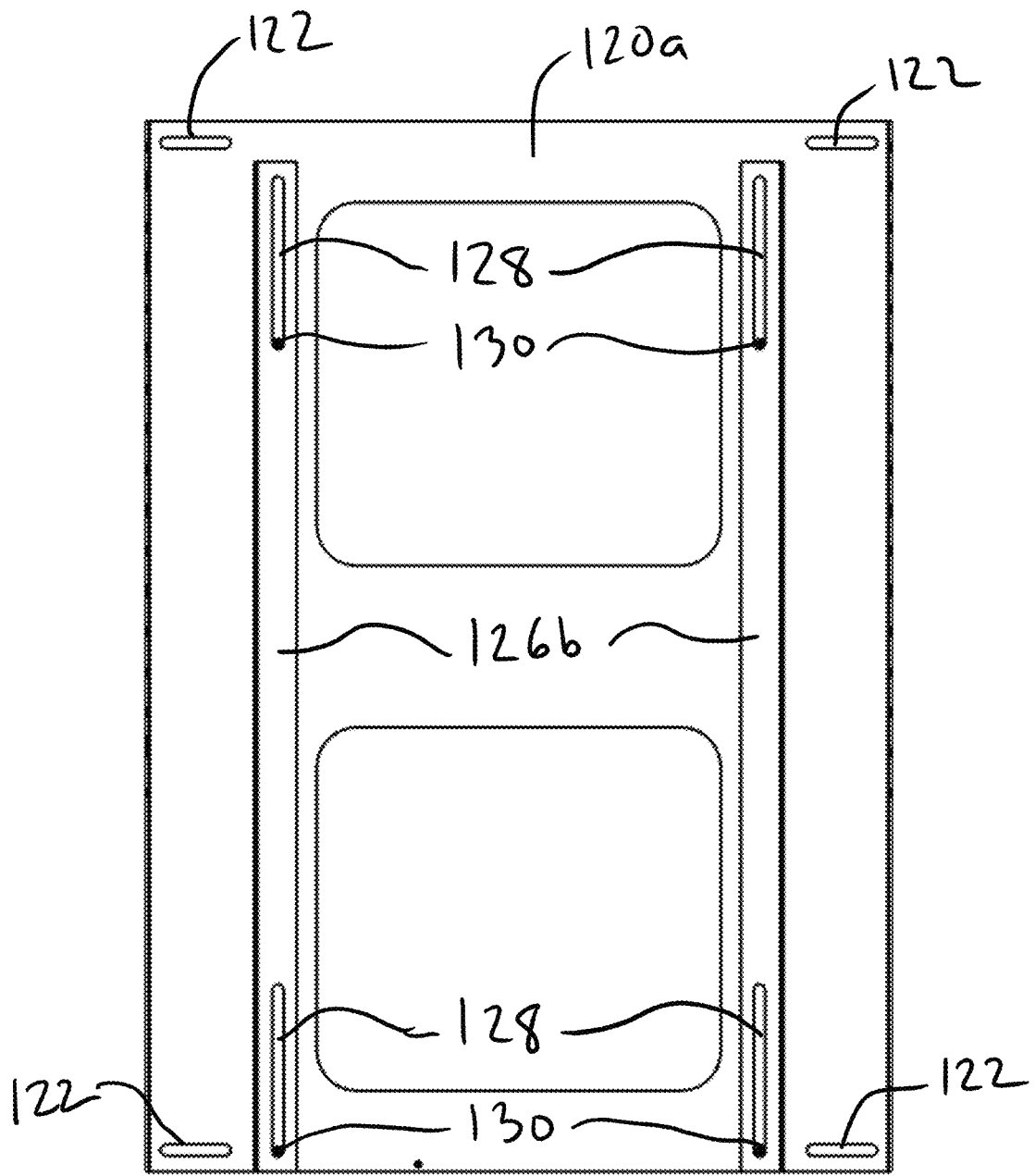
FIG. 6 is a rear side elevational cross-sectional view of the mounting bracket and sliding bracket of FIG. 3.

The front panel 118 of the jukebox 114 may be hingedly attached to the back panel 115, either directly or through connection to other portions of the cabinet 117. In this manner, the jukebox 114 may be opened for service while remaining mounted on the wall or other surface via the sliding bracket 126 and mounting bracket 120. For example, when opening the jukebox 114, the back panel 115 may remain stationary while the front panel 118 pivots generally away from the back panel 115 to allow interior access. In operation, the front panel 118 may be locked to the back panel 115 to prevent accidental and/or unauthorized opening of the jukebox 114. For example, FIGS. 2-3 show a keyhole 150 near a top edge of the front panel 118 for operating a rotating latch (not shown) that interacts with the back panel 115 or another stationary component to prevent opening of the jukebox 114 when locked. Insertion of a key (not shown) into the keyhole 150 allows rotation of the latch out of its locking configuration with the back panel 115, allowing the front panel 118 to pivot away from the back panel 115. While a key lock is shown in FIGS. 2-3, other types of locks, latches, fasteners, or the like may be used to keep the front panel 118 and the back panel 115 closed together. In addition, other constructions of the jukebox 114 can be used as well for allowing access to the interior, such as slidable panels, removable panels, or the like.

The front panel 118 of the jukebox 114 may include a light display 152 for providing dynamic and/or static lighting. In FIGS. 2-3, the light display 152 is a full, LED backlit, LCD panel that can be used to output light shows, static or dynamic text displays, equalizer displays, advertisements, or the like. However, other types of LCD panels can be used as well, including CCFL-backlit displays, segmented LCD panels, or the like. Alternative embodiments may use an LED array across one or more portions of the front panel 118 for providing similar types of light displays and messaging.

Figure 7:
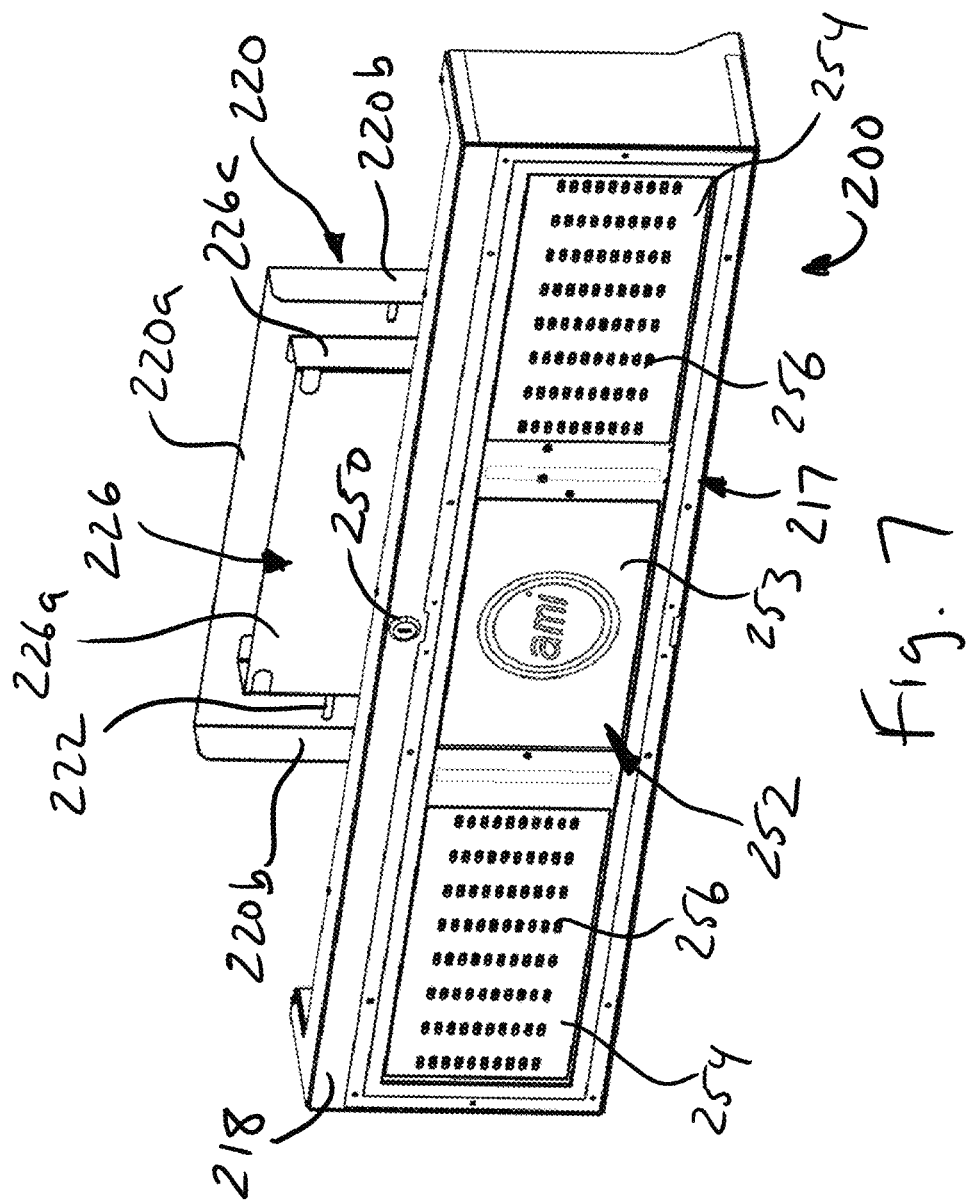
FIG. 7 is a front side perspective view of a third example embodiment of the wall-mounted jukebox with a mounting bracket and sliding bracket.
Figure 8:
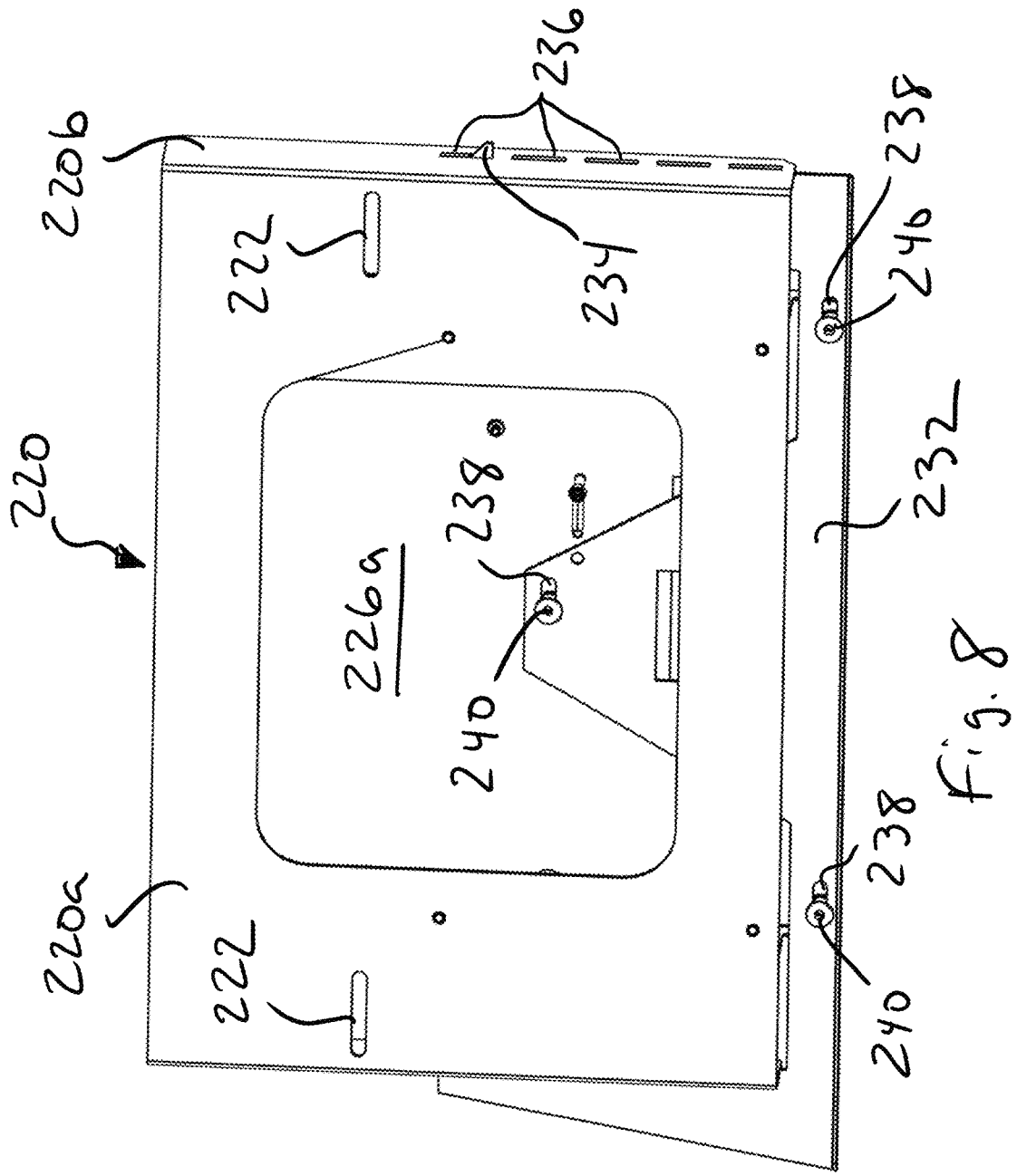
FIG. 8 is a rear side perspective view of the mounting bracket and sliding bracket of FIG. 7.

FIGS. 7-8 show a third example embodiment of a wall-mounted jukebox system 200. For simplicity, the video display and top light are not shown. Like numerals have been used for like elements, except the 200 series numerals have been used for the example embodiment shown in FIGS. 7-8. Accordingly, a complete description of the embodiment has been omitted, with only the differences being described.

The wall-mounted jukebox system 200 may be mounted to a wall or other surface (not shown) particularly where a video display has previously been installed. Unlike the embodiment shown in FIGS. 2-6, the mounting plate 220 in FIGS. 7-8 does not include mount holes. That is, the mounting plate 220 can be installed independently of any mount used for the video display. For example, the mounting plate 220 can be inserted behind a pre-installed video display monitor and attached to the wall via mounting slots 222.

The embodiment in FIGS. 7-8 may conveniently allow for adjustability in the operative position of the jukebox 214 relative to the mounting plate 220 and the video display. The rails 220b of the mounting plate 220 may each include a plurality of latch slots 236 vertically spaced apart from one another. The pair of latch slots 236 on the rails 220b that are engaged by the latching hooks 234 of the latch bar 232 can determine the height of the latch bar 232 relative to the mounting plate 220. For example, in FIG. 8, the latching hooks 234 are inserted into the top-most latch slots 236, meaning the latch bar 232, and the sliding bracket 226 and/or jukebox 214 to which it is connected, is at its highest location relative to the mounting plate 220. Engagement of lower latch slots 236 will provide successively lower operating positions for the jukebox 214. In this manner, an appropriate position of the jukebox 214 relative to the video display can be selected irrespective of the relative placement of the mounting plate 220 to the video display. A similar configuration could be utilized with the embodiment in FIGS. 2-6 as well, although adjustments would be necessary to avoid interference between the latch slots 136 for receiving the latch bar 132 and the mount holes 124 that receive the display mount.

Similar to the embodiment of FIGS. 2-6, the jukebox 214 may include a cabinet 217 with a front panel 218 that can be opened via a keyhole 250 to allow pivoting away from a back panel (not shown) and the sliding bracket 226 and mounting bracket 220. The front panel 218 may also include a display 252. In this embodiment, the display 252 includes a center section 253 and two side sections 254 surrounding the center section 253. The side sections 254 each include multiple columns 256 of LED lights that can act as an equalizer display during music play by the jukebox 214. The center section 253 in this embodiment includes static lighting that can illuminate interchangeable graphics. This is similar to the jukebox 14 shown in FIG. 1. In other embodiments, the center section 253 may be an LCD panel or the like, similar to the embodiment of FIGS. 2-6.

Figure 9:
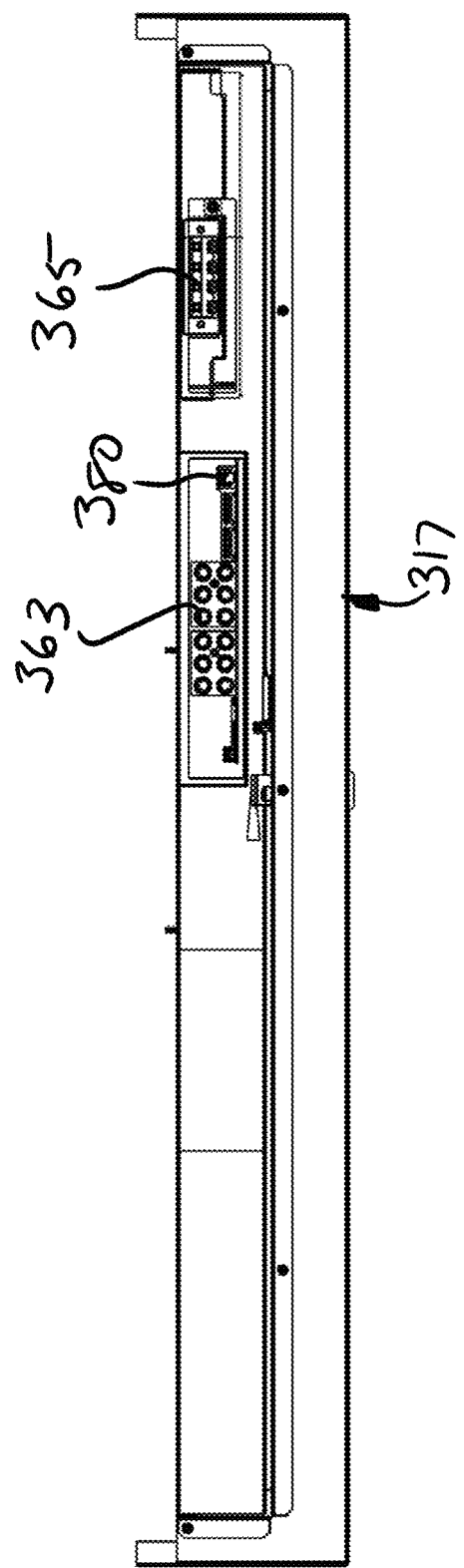
FIG. 9 is a top plan view of the wall-mounted jukebox of FIG. 7.
Figure 10:
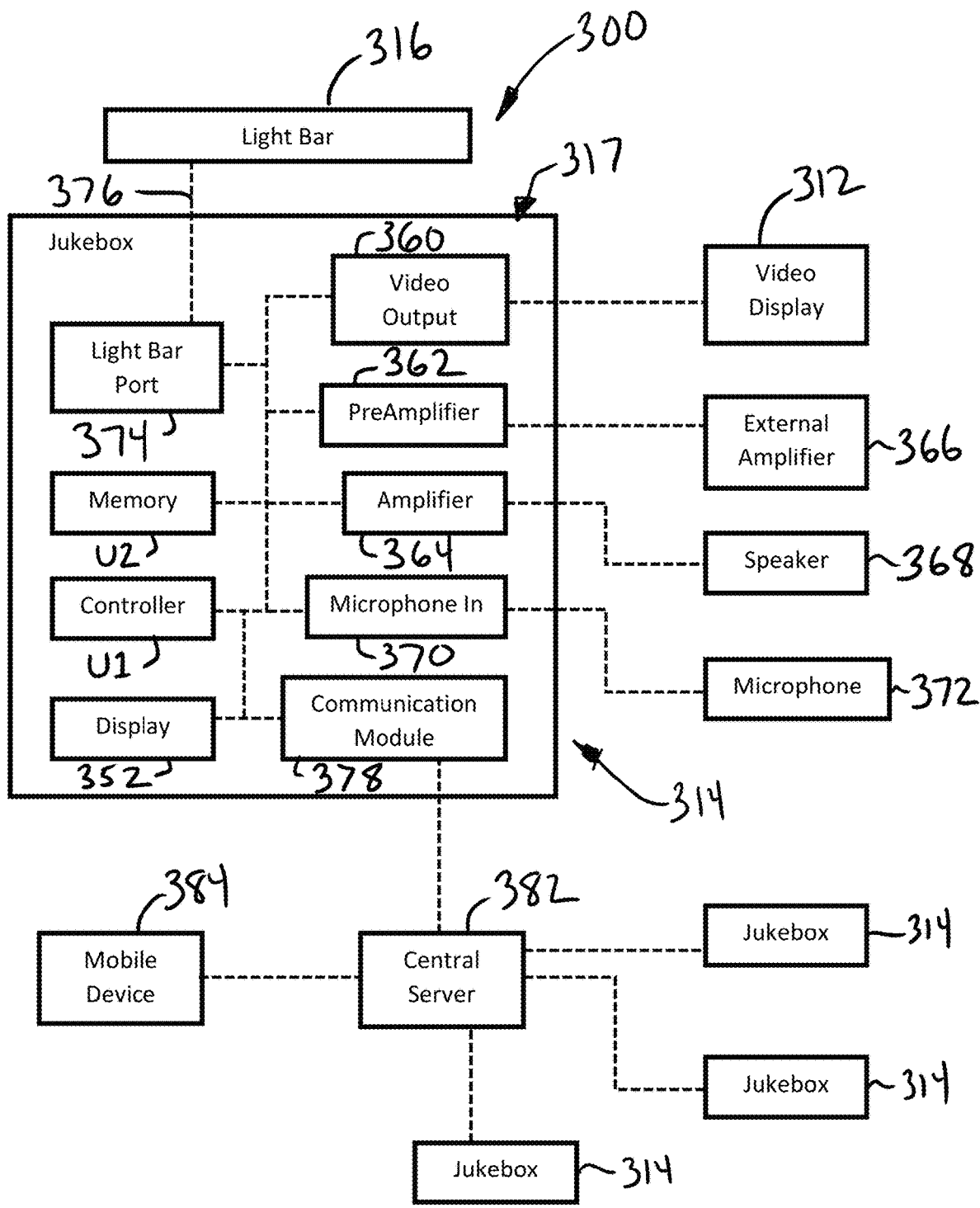
FIG. 10 is a schematic block diagram of a wall-mounted jukebox system connected to a server and various external components in accordance with a fourth example embodiment.

FIGS. 9 and 10 show more details of an example jukebox 314, many of which may be common to or used with the jukeboxes 14, 114, 214 shown in the earlier embodiments. The jukebox 314, and specifically the cabinet thereof 317, may be dimensioned to aesthetically mount adjacent to various video display 312 sizes and having varying mounting orientations—for example, some video displays 312 may be tilted instead of mounted vertically to maximize viewing angles or the like. Similarly, the brackets described above may be dimensioned according to video display 312 sizes, as necessary. For example, the mounting bracket 120 shown in FIGS. 3-6 may be made larger for accommodating larger video displays 312, as necessary.

The cabinet 317 may house (either internally, partially internally, or at an exterior portion thereof), many of the components to be described herein. The jukebox 314 may include a controller U1 and a memory U2. The memory U2 can be any known or suitable memory device or combination of such devices such as RAM, SRAM, DRAM, ROM, EPROM, EEPROM, flash memory, hard disk, optical disk, or the like. The memory U2 may store code or software for carrying out the processes described below, or for carrying out other operations or functionality of the jukebox 314. The memory U2 may also serve as a buffer or other temporary storage for digital music or video files streamed from a network source for play by the jukebox 314. The memory U2 may also, in some instances, locally store digital music and/or video files for selection and play by the jukebox 314, for example in a cache or more permanent storage. The controller U1 is preferably composed of one or more microprocessors, but other types of controllers, such as application specific integrated circuits (ASIC), logic circuits, combinations of the preceding types, or the like may be used as well.

The jukebox preferably includes one or more video output ports 360 for connection to the video display 312. The jukebox 314 may play digital video files, such as music videos, advertisements, or the like via the video display 312. At least one video output port 360 is preferably an HDMI port, although other types of video output ports may be used additionally or alternatively, such as DVI, VGA, DisplayPort, USB Type-C, or the like. When multiple video output ports 360 are available, the controller U1 may automatically detect which port 360 is connected to the video display 312. Videos are preferably played using High Definition 1080p, but are not so limited, and may be played using nearly any resolution available and/or desired. If a location requires more than one video display 312 to be connected to the jukebox 314, use of an HDMI or other video cable splitter (not shown) may be utilized. The controller U1 may also be configured to adjust syncing of audio with videos presented on the video display 312.

The jukebox can include either an audio preamplifer 362 with direct line output or an audio amplifier 364, but may include both, as shown, for example, in FIGS. 9-10. The preamplifier 362 may include one or more audio lines out to an external amplifier 366, such as one or more "RCA" stereo jacks 363, composite audio, optical audio, differential audio, combinations thereof, or the like. The amplifier 364 may allow a direct connection to one or more speakers 368, such as by spring terminals 365 or other types of standard stereo terminals, a 3.5 mm TRS jack, a ¼ inch TRS jack, combinations thereof or the like. The jukebox 314 may further include one or more audio inputs (not shown), for example to receive audio signals from other external devices. The jukebox 314 may also include one or more microphone in ports 370 (such as TRS, XLR, combinations thereof, or the like) that can connect to one or more microphones 372, which can allow for use of the jukebox 314 for karaoke, announcements, or the like.

The jukebox 314 may also include a light bar port 374 preferably capable of outputting power and control signals for use by the light bar 316. The light bar 316 may connect to the light bar port 374 via a wire harness 376, although a multi-pin connector cable or any other like wired connection may be used as well. In still other embodiments, the light bar 316 may be provided with its own power cord (not shown), and/or control signals may be sent to the light bar 316 from the jukebox 314 via a wireless connection.

The light bar 316 may include one or more LEDs, although other types of light bulbs, including incandescent, CFL, fluorescent tubes, or the like may be used as well. The light bar 316 may be color changing, particularly in response to music played by the jukebox 314 in order to provide eye-catching displays. The light bar 316 may light up to match the lighting on the front of the jukebox 314, as described earlier. In other embodiments, the light bar 316 may be a full LCD or similar display and could be capable of providing messages or the like. The light bar 316 is preferably dimensioned to match a width of the jukebox 314, although different dimensions can be used depending on various factors, such as lighting requirements, the size of the video display 312, and the like. The light bar 316 may be mounted to the video display 312 via various methods, which are preferably easily reversible, such as adhesive tape, hook-and-loop fasteners, clips, or the like. The light bar 316 may alternatively be attached to the mounting hardware of the jukebox 314, such as the mounting bracket 120 (FIGS. 3-6), either permanently (e.g., by welding or the like) or removably (e.g., with removable fasteners, adhesive tape, or the like).

The jukebox 314 further may include a communication module 378, which may be configured for wireless and/or wired communication. For example, the communication module 378 may enable communication over one or more of WI-FI, BLUETOOTH, ZIGBEE, Z-WAVE, 3G, 4G, or 5G cellular, infrared, or other types of wireless protocols. Alternatively or in addition, the communication module 378 may provide an Ethernet port 380 for connection to a local area network (LAN) or the like, or have a port for connection to other similar types of wired networks or configurations.

FIG. 10 shows the jukebox 314 as part of a network having a plurality of additional jukebox devices 314 connected thereto. Each of the jukebox devices 314 is preferably in communication with a central server 382. However, intermediate connections to the server 382, such as additional file servers, computers, other jukebox devices 314, or the like, may also be implemented. Further, functions of the server 382 may be divided among a plurality of devices. The central server 382 may store digital music and/or video files that may be retrieved for play by the controller U1, additional data (e.g., usage statistics, play data, popularity lists, or the like) that can be downloaded or referenced by the jukebox 314, firmware updates for the jukebox 314, or other like data or programming. The controller U1 may also communicate with other devices or file servers, access the Internet, communicate over wide area networks (WANs) or LANs, or the like.

In order to provide a robust selection of songs and videos for play, and to efficiently incorporate new material or make adjustments, digital music and video files may be stored on the central server 382 and downloaded or streamed on demand by the controller U1 when selected at the jukebox 314, although in some embodiments a song and/or video library may be stored at least partially locally in the memory U2. For example, the most popular songs or videos may be stored locally for faster play or in the event of a network failure. Digital music files may be stored in the central server 382 or the jukebox 314 in any conventional format, such as MP3, WAV, WMA, M4A, or the like. Digital video files may similarly be stored in conventional format, such as MP4, MPEG, WMV, AVI, M4V, or the like. Digital music and/or video files preferably also include identifying metadata, at least some of which may be provided on the video display 312 or elsewhere during selection menus, advertising, and/or play of the associated file.

The jukebox 314 preferably does not include a conventional physical user interface, such as a touchscreen, keypad, or the like used for selecting songs and/or videos for play. The removal of such a user interface enables a lower cost for the jukebox 314 and makes it easier to mount near or with existing video displays 312 due to the reduced size requirements. Accordingly, to enable a user to select a song or video for play by the jukebox 314 (and potentially through the video display 312), the user may utilize a mobile device 384, such as a smartphone, tablet, laptop, or the like. The mobile device 384 preferably communicates with the central server 382 over a network or the Internet in order to make selections on the local jukebox 314. However, the mobile device 384 may alternatively, or additionally, have the ability to communicate directly with the jukebox 314 in a wireless manner, such as over a BLUETOOTH or other type of peer-to-peer network, or through a local router via WI-FI or the like. Wired communication between the mobile device 384 and the jukebox 314 may also or alternatively be utilized, such as through Ethernet, USB, COM port, or other like wired interfaces.

The mobile device 384 may have a dedicated application installed thereon, such as the "AMI MUSIC" app available from Applicant or the like, to facilitate browsing and selection of available songs and/or videos on the jukebox 314. Alternatively, the user may be able to access the jukebox 314 library via a browser-based application over the Internet. In some embodiments, the user may be able to select the precise jukebox 314 from a list provided on the mobile device. In other embodiments, jukebox 314 selection may be automatically set at the central server 382 based on location data (e.g., provided by GPS or the like) from the mobile device 384. In still other embodiments, a code may be provided to the user (such as an alphanumeric code or a scannable QR code or the like) that the mobile device 384 sends to the central server 382 to verify the correct jukebox 314. In yet other embodiments, the jukebox 314 itself may detect and/or verify the mobile device 384 to make the connection.

Once the mobile device 384 is functionally connected to the jukebox 314, in operation, a user may use the mobile device 384 to select a song and/or video for play. In embodiments where the selected digital music and/or video file is stored in the central server 382, the central server 382 may push the selected file to the jukebox 314, or the jukebox 314 may request the appropriate files from the central server 382. In still other embodiments, the central server 382 may initiate, or the jukebox 314 may request, a stream of the file. In embodiments where the selected digital music and/or video file is stored locally in the memory U2 of the jukebox 314, the central server 382 may issue an instruction to the controller U1 to play the selected file or at least notify the controller U1 of the file selected for play. In still other embodiments, the jukebox 314 can react directly to selections made by the user on the mobile device 384 (i.e., without communication from the central server 382).

The user may also pay for the song/video selections using the mobile device 384. For example, the installed application or browser application may accept credit card, direct debit, mobile payment (e.g., PayPal, Venmo, or the like), or other payment information from the user in exchange for song/video selection on the jukebox 314, or for payment into a stored account that can be saved for future use and debited as songs or videos are selected on the jukebox 314 or elsewhere in the network (e.g., on jukeboxes 314 located at other venues).

Since multiple users may use multiple mobile devices 384 at a venue to access the jukebox 314, as opposed to the jukebox 314 having a single physical user interface that users would have to take turns accessing, the jukebox 314 and/or the central server 382 should be configured to accommodate and sort simultaneous requests. For example, the central server 382 and/or the controller U1 in the jukebox 314 may queue song/video selections from multiple users in the order in which the selections were received. Other methods could include ordering song/video selections by popularity (e.g., more popular selections take precedence), total number of selections by a single user (e.g., a user who has selected more songs will get his or her songs played first), or the like. It may also be desirable to have video selections take precedence over audio-only selections. Still further, the application may give a user the opportunity to jump the line by paying more for his or her song/video selection(s).

An operator of the jukebox 314 (e.g., an owner, venue manager, route operator, or the like) may similarly utilize a mobile device 384 for accessing management features of the jukebox 314. For example, the mobile device 384 may have an application installed such as "AMI Co-Pilot" available from Applicant or may enable the operator to access a browser-based application over the Internet to enable access to operator features. Access to jukebox 314 functions is preferably protected by password or the like. For example, the operator can have the ability through the mobile device 384 to reject or skip unwanted songs, mute or change volume on the jukebox 314, power the jukebox 314 on or off (such as during a sporting event or the like), reboot the jukebox 314, or the like. A route operator can also grant these access privileges to a venue owner as well, for example in a pared-down version of the application. The mobile device 384 can allow the operator to view route connections, check revenue, access contact information, get driving directions, add/edit location managers, control installed systems, and the like. The mobile device 384 can also allow an operator to create advertisements that could be played on the jukebox 314, the video display 312, or the like.

While specific and distinct embodiments have been shown in the drawings, various individual elements or combinations of elements from the different embodiments may be combined with one another while in keeping with the spirit and scope of the invention. Thus, an individual feature described herein only with respect to one embodiment should not be construed as being incompatible with other embodiments described herein or otherwise encompassed by the invention.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined herein.

We claim:

1. A wall-mounted jukebox system configured to be mounted adjacent to a wall-mounted external video display, the jukebox system comprising:
    a jukebox including:
        a controller configured to play at least one of digital music or digital video files,
        a communication module connected to the controller and configured for at least one of wireless or wired communication with one or more external devices,
        a video output port connected to the controller and configured to enable the jukebox to be connected to the wall-mounted external video display, and
        a cabinet housing the controller, communication module, and video output port; and
    a mounting bracket configured to receive the jukebox and to be affixed to the wall adjacent to the wall-mounted external video display,
wherein the jukebox lacks a physical user interface, a video display screen, and a physical payment acceptor, and selection of the at least one digital music or digital video file for play by the controller and payment are received through the communication module from one of the external devices.

2. The wall-mounted jukebox system of claim 1, further comprising:
    a sliding bracket connected to the cabinet, wherein the mounting bracket is configured to receive the sliding bracket for slidable movement of the sliding bracket and the jukebox relative to the mounting bracket; and
    a lock provided on one of the sliding bracket or the mounting bracket that, when engaged to the other of the sliding bracket or the mounting bracket, prevents the slidable movement of the sliding bracket and the jukebox relative to the mounting bracket.

3. The wall-mounted jukebox system of claim 2, wherein:
    the lock is a latch bar provided on the sliding bracket, the latch bar including at least one latching hook,
    the mounting bracket includes at least one latch slot, and
    the lock engagement includes insertion of the at least one latching hook into the at least one latch slot.

4. The wall-mounted jukebox system of claim 3, wherein the mounting bracket includes a generally planar attachment plate and a pair of rails connected to the attachment plate and extending generally perpendicularly away therefrom.

5. The wall-mounted jukebox system of claim 4, wherein the at least one latch slot is provided in at least one of the rails of the mounting bracket.

6. The wall-mounted jukebox system of claim 3, wherein the mounting bracket includes a plurality of latch slots.

7. The wall-mounted jukebox system of claim 3, wherein the latch bar includes at least one guide track configured to receive at least one guide pin attached to at least one of the sliding bracket or the jukebox, the at least one guide pin being movable within the at least one guide track when the latch bar moves relative to the sliding bracket.

8. The wall-mounted jukebox system of claim 2, wherein the mounting bracket includes a generally planar attachment plate and a pair of rails connected to the attachment plate and extending generally perpendicularly away therefrom.

9. The wall-mounted jukebox system of claim 8, wherein the attachment plate includes a plurality of mounting slots formed therethrough.

10. The wall-mounted jukebox system of claim 8, wherein the rails include a plurality of display mount holes configured to connect with a display mount of the wall-mounted external video display.

11. The wall-mounted jukebox system of claim 2, wherein the sliding bracket includes a main plate and a pair of side rails.

12. The wall-mounted jukebox system of claim 11, wherein each side rail includes one or more guide slots configured to receive a respective guide pin extending from the mounting bracket, each guide pin being movable within the respective one or more guide slots when the sliding bracket is moved relative to the mounting bracket.

13. The wall-mounted jukebox system of claim 1, further comprising a light bar one or more light emitting elements disposed therein, operation of the one or more light emitting elements being controllable by the controller of the jukebox.

14. The wall-mounted jukebox system of claim 13, wherein the light bar is configured to mount to the wall-mounted external video display.

15. The wall-mounted jukebox system of claim 13, wherein the jukebox further includes a light bar port housed by the cabinet and connectable to the light bar.

16. The wall-mounted jukebox system of claim 1, wherein the communication module is connectable to a wireless network.

17. The wall-mounted jukebox system of claim 16, wherein the wireless network is one of a Wi-Fi network or a cellular network.

18. The wall-mounted jukebox system of claim 1, wherein the video output port is an HDMI port.

19. The wall-mounted jukebox system of claim 1, wherein the jukebox includes at least one of an audio preamplifier with direct line output or an amplifier configured to connect to one or more speakers.

* * * * *